(12) United States Patent
Huang et al.

(10) Patent No.: US 7,372,117 B2
(45) Date of Patent: May 13, 2008

(54) MAGNETO-RESISTANCE TRANSISTOR AND METHOD THEREOF

(75) Inventors: Ying-Wen Huang, Hsinchu (TW); Chi-Kuen Lo, Hsinchu (JP); Yeong-Der Yao, Hsinchu (TW); Lan-Chin Hsieh, Hsinchu (TW); Jau-Jiu Ju, Hsinchu (TW); Der-Ray Huang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 302 days.

(21) Appl. No.: 10/942,114

(22) Filed: Sep. 16, 2004

(65) Prior Publication Data

US 2006/0054931 A1 Mar. 16, 2006

(51) Int. Cl.
*H01L 29/82* (2006.01)
*H01L 43/00* (2006.01)

(52) U.S. Cl. .............. 257/421; 257/423; 257/565
(58) Field of Classification Search ............... 257/421, 257/423, 565
See application file for complete search history.

(56) References Cited

U.S. PATENT DOCUMENTS

| | | | |
|---|---|---|---|
| 5,565,695 A | 10/1996 | Johnson | |
| 5,747,859 A | 5/1998 | Mizushima et al. | |
| 5,973,334 A | 10/1999 | Mizushima et al. | |
| 6,178,112 B1* | 1/2001 | Bessho et al. | 365/173 |
| 6,218,718 B1 | 4/2001 | Gregg et al. | |
| 6,841,259 B1* | 1/2005 | Takahashi et al. | 428/812 |
| 6,878,979 B2* | 4/2005 | Matsukawa et al. | 257/295 |
| 6,919,608 B2* | 7/2005 | Gregg | 257/423 |
| 6,921,954 B2* | 7/2005 | Sharma | 257/421 |
| 2003/0122208 A1 | 7/2003 | Sato et al. | |
| 2003/0164509 A1 | 9/2003 | Gregg | |
| 2004/0160800 A1 | 8/2004 | Johnson | |
| 2006/0177947 A1* | 8/2006 | Yoshida et al. | 438/3 |

FOREIGN PATENT DOCUMENTS

JP 2003-92412 3/2003

(Continued)

OTHER PUBLICATIONS

D.J. Monsma et al. (1995), "Perpendicular Hot Electron Spin-Valve Effect in a New Magnetic Field Sensor: The Spin-Valve Transistor", Physical Review Letters, vol. 74, No. 26, pp. 5260-5263.

(Continued)

*Primary Examiner*—Fernando L. Toledo
(74) *Attorney, Agent, or Firm*—Rabin & Berdo, P.C.

(57) ABSTRACT

A magneto-resistance transistor including a magneto-resistant element which may function as an emitter and a passive element which may function as a collector. The base may be interposed between the passive element and the magneto-resistant element, thereby coupling the passive element with the magneto-resistant element. A magnetic field of a given strength may be applied to at least a portion of the magneto-resistant transistor, the given strength determining a resistance in the at least a portion of the magneto-resistant transistor. Thus, by adjusting the given strength of the magnetic field, the resistance may be adjusted. Therefore, different emitter current inputs may be achieved with a fixed voltage. Further, a base current may vary with a controlled variation of the emitter current input.

19 Claims, 10 Drawing Sheets

FOREIGN PATENT DOCUMENTS

JP 2003-188390 7/2003
KR 10-2004-0039493 5/2004

OTHER PUBLICATIONS

R. Sato et al.(2002), "Spin-valve transistor with an Fe/Au/Fe(001) base", Applied Physics Letters, vol. 79, No. 8, pp. 1157-1159.

Sebastuaan Van Dijken et al.(2002), "Room temperature operation of a high output current magnetic tunnel transistor", Applied Physics Letters, vol. 80, No. 18, pp. 3364-3366.

O. M. J. van 't Erve et al.(2002), "Transfer ratio of the spin-valve transistor", Applied Physics Letters, vol. 80, No. 20, pp. 3787-3789.

Sebastuaan Van Dijken et al.(2003), "Giant magnetocurrent exceeding 3400% in magnetic tunnel transistors with spin-valve base layers", Applied Physics Letters, vol. 83, No. 5, pp. 951-953.

The Office Action issued by Korea Patent and Trademark Office on Jun. 29, 2007.

\* cited by examiner

MAGNETO-RESISTANCE TRANSISTOR AND METHOD THEREOF

BACKGROUND OF THE INVENTION

1. Field of Invention

The present invention relates to a transistor, and more particularly to a magneto-resistance transistor and method thereof.

2. Related Art

Conventional spin transistors may be electronic devices that may use a magnetic field to control an electric current. The effect of spin transistors may be similar to the effect of conventional transistors. An electron may have two spin states: spin up and spin down. The spin states of the electron may be control parameters in conventional transistors.

Conventional spin transistors may have an additional control parameter, namely, a magnetic field. The magnetic field used by a conventional spin transistor may control the electric current by manipulating the spin states of electrons. Thus, electronic devices including conventional spin transistors may have enhanced functionality as compared to electronic devices including only conventional transistors.

Conventional spin transistors may include a bi-potential energy barrier structure (i.e. two potential energy barriers may be combined with a magneto-resistant device in the conventional spin transistor). The bi-potential energy barrier structures may be configured to allow magneto-electric current to pass through the conventional spin transistor.

Other conventional spin transistors may include a first and second n-type ion-doped silicon substrates placed such that each substrate is oriented toward the other. The first and second n-type ion-doped silicon substrates may be vacuum adhered to form an emitter and a collector, respectively. A metallic spin valve (i.e., a base) may be placed between the first and second n-type ion-doped silicon substrates.

The conventional spin transistor may further include two pairs of layers. The first pair of layers may include an emitter (i.e. the first n-type ion-doped silicon substrate) and a base (i.e. the metallic spin valve), the pair of layers formed of platinum (Pt) and Cobalt (Co), respectively. The second pair of layers may include a base to collector (i.e. the second n-type ion-doped silicon substrate), the pair of layers formed of Copper (Cu) and Co, respectively. The above-described first and second pair of layers may form a Schottky barrier diode structure.

When a forward voltage bias is applied to the emitter (i.e. the first n-type ion-doped silicon substrate) and the base (i.e. the metallic spin valve), the hot electrons may exceed a threshold of the energy barrier and may flow through the energy barrier and into the collector. The conduction of the hot electrons may depend on whether the magnetizations of the two Co layers (i.e., the two potential barriers) included in the metallic spin valve have a same direction.

If the external magnetic field is small, the states of the two Co layers may be anti-parallel. In this case, the spin up or spin down electrons may be spin inelastic scattering and the current flow of collector may be relatively small.

If the external magnetic field is large enough to align the magnetizations of the two Co layers in parallel, the probability of spin up electrons flow may increase, thereby increasing the electric current. With conventional spin transistors, a current fluctuation rate of more than 200% of the magneto-electric current may be obtained at ambient temperature. However, the electric current output of conventional spin transistors may be small, thereby limiting their utilization in lower current applications (e.g., in a range from 1.287 pA to 44 pA). Further, conventional spin transistors may be more difficult to miniaturize.

Another conventional spin transistor may include a magnetic tunnel layer formed as a base adjacent to a collector, the collector being formed by an n-type GaAs substrate. The conventional spin transistor may be a Schottky barrier diode structure. An aluminum layer may be formed on the base and may be oxidized into an aluminum oxide ($Al_2O_3$) layer. An emitter layer may be formed on the aluminum oxide layer, thereby forming another Schottky barrier diode structure. The above-described structure may reduce existing problems in the manufacture of conventional spin transistors, including miniaturization and/or an increased magneto-electric current fluctuation rate. For example, by this method, a current fluctuation rate of more than 3,400% at lower temperature (e.g., 77 Kelvin) may be achieved. However, the GaAs substrate may have a higher cost and/or the aluminum oxide layer may not be formed as a uniform layer. Further, the above-described conventional spin transistor may require a lower electric current input so as to reduce or prevent damage to the aluminum oxide included in the aluminum oxide layer. Accordingly, since only a lower electric current input may be used with the above-described conventional spin transistor, the electric current output of the conventional spin transistor may also be lower, thereby limiting their use to lower current applications. Further, the above-described conventional spin transistor may have the additional requirement of operating only at lower temperatures in order to provide an acceptable magneto-electric current fluctuation rate.

Yet another conventional spin transistor may include a magnetic tunnel transistor, which may increase the operating temperature of the bi-potential energy barrier spin transistor. At ambient temperature, the conventional spin transistor may provide up to 1 μA of electric current output and/or the magneto-electric current fluctuation rate may increase up to 64%. In this conventional spin transistor, a cobalt-iron alloy ($Co_{84}Fe_{16}$) layer of 3 nm may be formed as the base on an emitter formed of a n-type GaAs substrate. An aluminum layer oxidized into an aluminum oxide layer may be formed on the cobalt-iron alloy layer (i.e. the base). A ($Co_{84}Fe_{16}$) layer of 5 nm may be formed as the emitter on the aluminum oxide layer. A pinning layer may be coated on the emitter. The pinning layer may include anti-ferromagnetic $Ir_{22}Mn_{78}$. The pinning layer may be capable of pinning the magnetic dipole of the emitter. The pinning layer may be covered with a tantalum (Ta) layer of 5 nm. The magnetic dipole of the base may be modified without affecting the magnetic dipole of the emitter. Thus, the spin direction of the injection electron may be controlled.

However, the above-described conventional spin transistor may include a GaAs substrate. The GaAs substrate may be expensive. Further, the aluminum oxide layer may not be formed as a uniform layer. Since the magneto-resistant device with a higher current fluctuation rate may require a higher-quality (i.e. uniform) layer, the complexity of the manufacturing process may increase as a more uniform aluminum oxide layer may be difficult to produce.

SUMMARY OF THE INVENTION

An example embodiment of the present invention is a magneto-resistance transistor including a magneto-resistant element used as an emitter, the magneto-resistant element including an adjustable resistance based on a given strength of a magnetic field, a passive element used as a collector, and a base, interposed between the emitter and the collector, for coupling the emitter and the collector.

Another example embodiment of the present invention is a magneto-resistance transistor including a passive element used as a collector, and a magneto-resistant element including a first portion and a second portion, the magneto-resistant element including an adjustable resistance based on a given strength of a magnetic field, wherein the first portion is adjacent to the passive element, the first portion coupling the passive element with the second portion.

Another example embodiment of the present invention is a magneto-resistance transistor, including a magneto-resistant element used as an emitter, the magneto-resistant element including an adjustable resistance based on a given strength of a magnetic field.

Another example embodiment of the present invention is a method of controlling electric current in a transistor, including applying a magnetic field of a given strength, the given strength determining a resistance in at least one portion of the transistor.

BRIEF DESCRIPTION OF THE DRAWINGS

The present invention will become more apparent by describing in detail example embodiments thereof with reference to the attached drawings in which.

DETAILED DESCRIPTION OF EXAMPLE EMBODIMENTS OF THE INVENTION

Hereinafter, example embodiments of the present invention will be described in detail with reference to the accompanying drawings.

Figure 1:
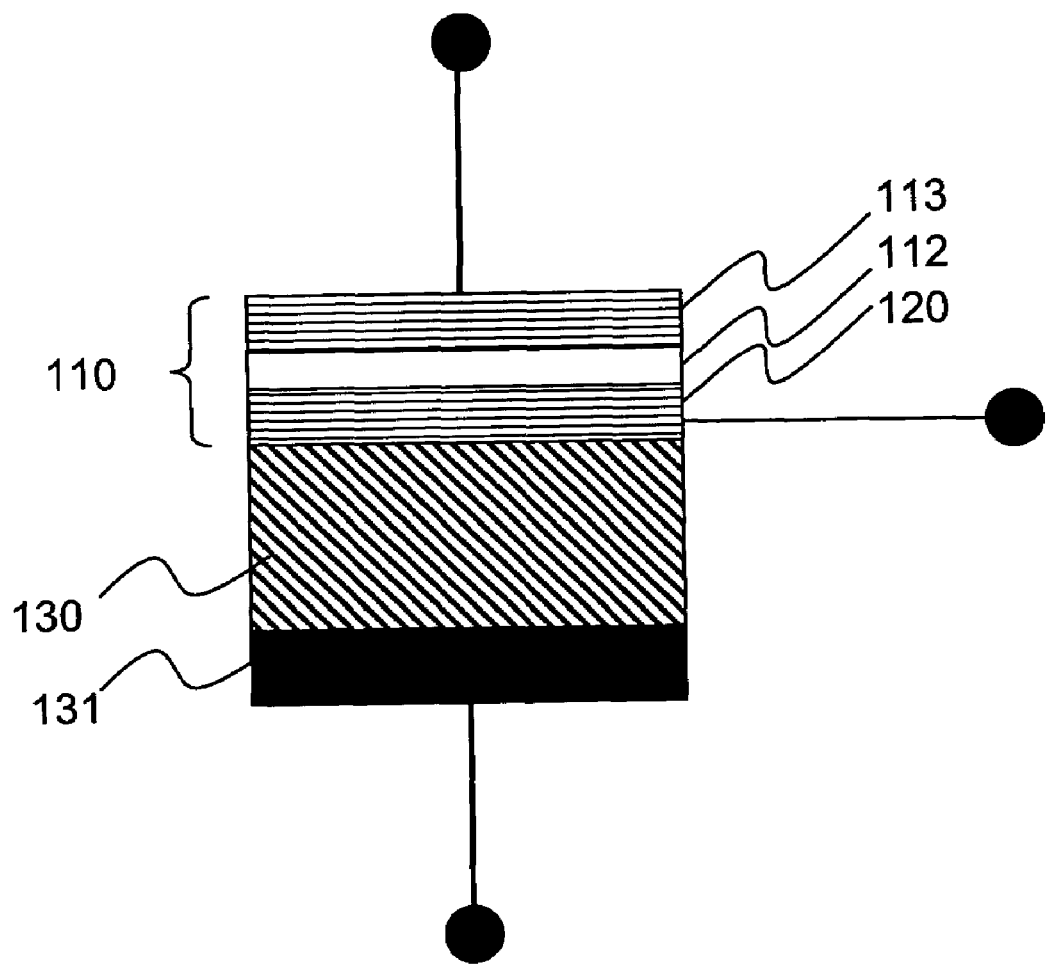
FIG. 1 illustrates a schematic view of a magneto-resistance transistor 100 according to an example embodiment of the present invention.

FIG. 1 illustrates a schematic view of a magneto-resistance transistor 100 according to an example embodiment of the present invention.

In another example embodiment of the present invention, referring to FIG. 1, the magneto-resistance transistor 100 may include a magneto-resistant element 110, a passive element 130 and/or an ohmic contact layer 131. As shown in FIG. 1, the magneto-resistant element 110, the passive element 130 and/or the ohmic contact layer 131 may be stacked. Further, the magneto-resistant element 110, the passive element 130, and/or the ohmic contact layer 131 may be formed on a plane of the magneto-resistance transistor 100.

In another example embodiment of the present invention, the magneto-resistant element 110 may be an emitter.

In another example embodiment of the present invention, the passive element 130 may be a collector.

In another example embodiment of the present invention, the passive element 130 may be a p-n junction diode.

In another example embodiment of the present invention, the ohmic contact layer 131 may be coated on a lower surface of the passive element 130.

In another example embodiment of the present invention, the ohmic contact layer 131 may include at least one of titanium (Ti) and/or gold (Au).

In another example embodiment of the present invention, the magneto-resistant element 110 may include an adjustable resistance, the adjustable resistance based on a given strength of an applied magnetic field.

In another example embodiment of the present invention, the magneto-resistant element 110 may include a magnetic tunnel element including a first ferromagnetic layer 111, an insulating layer 112 and a second ferromagnetic layer 113. The first ferromagnetic layer 111 may connect to the passive element 130, thereby forming the base 120. The base 120, as shown in FIG. 1, may be interposed between the emitter (i.e., the magneto-resistant element 110) and a collector (i.e., the passive element 130), such that the emitter is coupled to the collector (i.e., the passive element 130).

In another example embodiment of the present invention, an inputted emitter current $I_E$ may result from an emitter-to-base voltage $V_{EB}$ divided by a resistance of the magneto-resistant element 110. Thus, the magneto-resistant element 110 (i.e., the emitter) may provide an adjustable resistance. The adjustable resistance may be based on a given strength of an applied magnetic field. The inputted emitter current $I_E$ may affect a base current $I_B$ and a collector current $I_C$.

Figure 2:
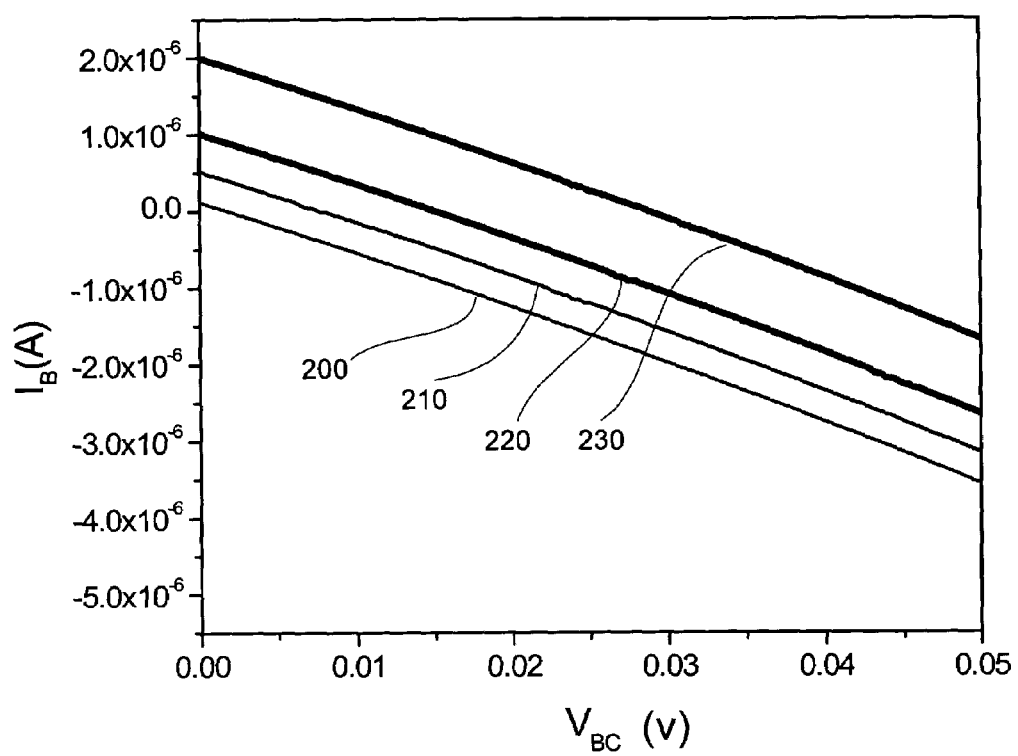
FIG. 2 is a graph illustrating characteristic curves of the base current $I_B$ of FIG. 1 according to another example embodiment of the present invention.

FIG. 2 is a graph illustrating characteristic curves 200, 210, 220 and 230 of the base current $I_B$ of FIG. 1 according to another example embodiment of the present invention.

In another example embodiment of the present invention, referring to FIG. 2, the ordinate axis (i.e. the y-axis) may represent the base current $I_B$, while the abscissa axis (i.e. the x-axis) may represent the base-to-collector voltage (i.e. the base voltage bias) $V_{BC}$. The characteristic curves 200, 210, 220 and 230 may illustrate a relationship between the base current $I_B$ and the base voltage bias $V_{BC}$ based on a given emitter current $I_E$. As shown, the given emitter current $I_E$ for the characteristic curves 200, 210, 220 and 230 may be 0.1 μA, 0.5 μA, 1 μA, and 2 μA, respectively.

Figure 3:
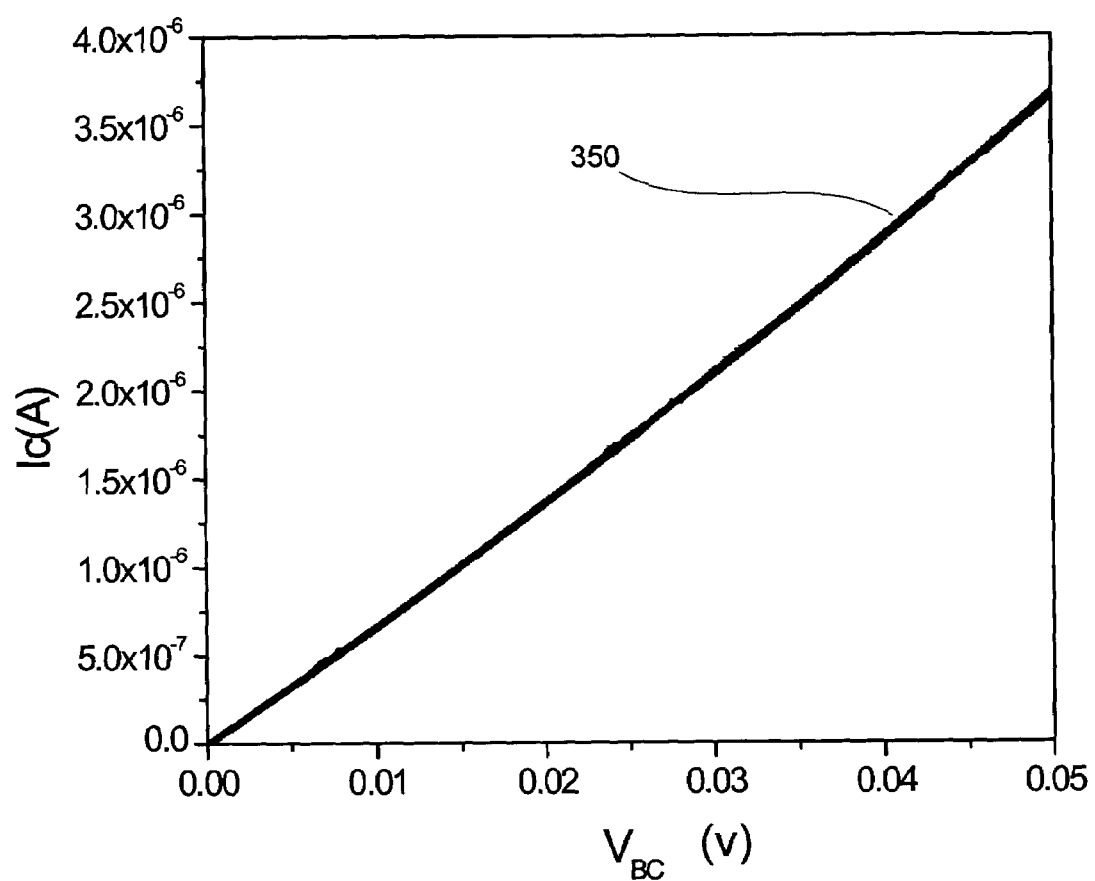
FIG. 3 is a graph illustrating a characteristic curve of the collector current $I_C$ of FIG. 1 according to another example embodiment of the present invention.

FIG. 3 is a graph illustrating a characteristic curve 350 of the collector current $I_C$ of FIG. 1 according to another example embodiment of the present invention.

In another example embodiment of the present invention, referring to FIG. 3, the ordinate axis may represent the collector current $I_C$ while the abscissa axis may represent the base voltage bias $V_{BC}$. The characteristic curve 350 may illustrate a relationship between the collector current $I_C$ and the base voltage bias $V_{BC}$ based on a given emitter current $I_E$. As shown, the given emitter current $I_E$ for the characteristic curve 350 may be any one of 0.1 μA, 0.5 μA, 1 μA, and 2 μA, respectively. Thus, it may be observed that the collector current $I_C$ may not change in response to a change in the emitter current $I_E$.

Figure 4:
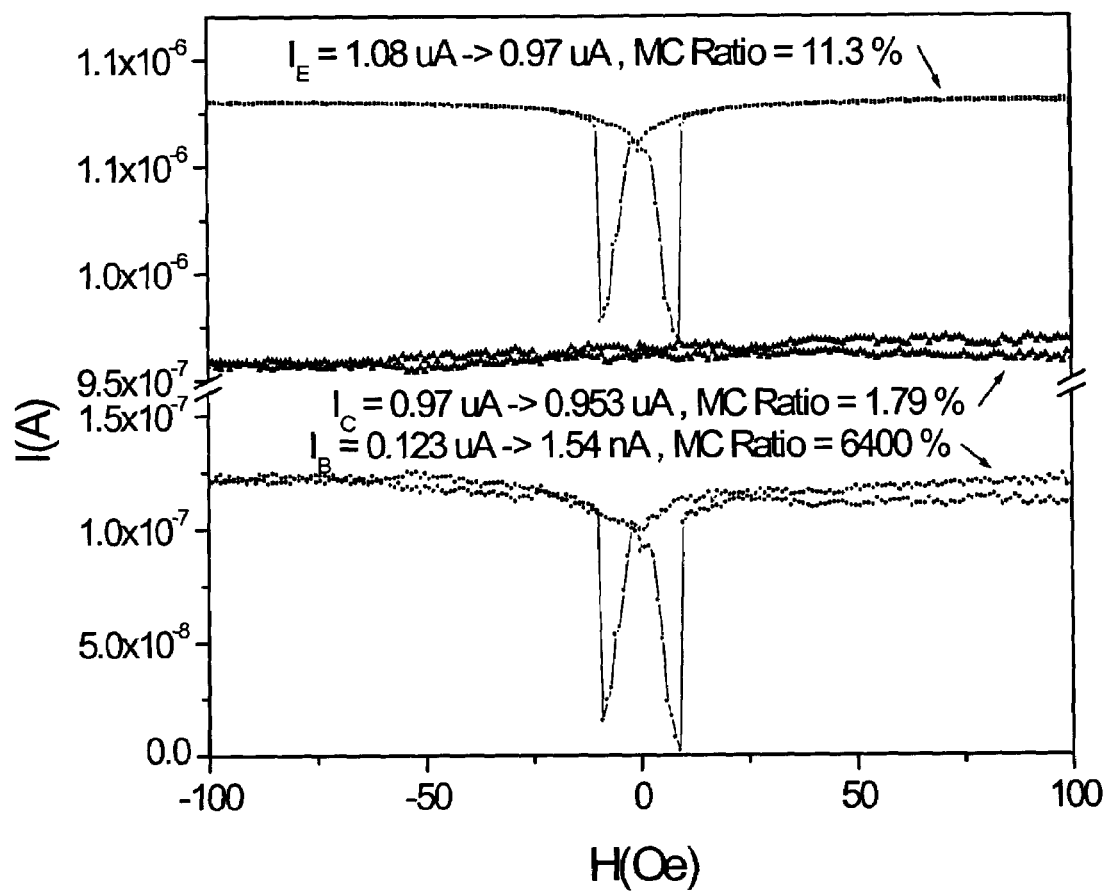
FIG. 4 is a graph illustrating the current fluctuation rate of the base, emitter and collector of FIG. 1 as measured in another example embodiment of the present invention.

FIG. 4 is a graph illustrating the current fluctuation rate of the base 120, emitter 110 and collector 130 of FIG. 1 as measured in another example embodiment of the present invention.

In another example embodiment of the present invention, referring to FIG. 4, the abscissa axis may represent a current variation while the ordinate axis may represent a given strength of a magnetic field. As shown, at a given magnetic field strength, the emitter current $I_E$ may decrease from 1.08 μA to 0.97 μA, and the current fluctuation rate for the emitter current $I_E$ may increase 11.3%. The base current $I_B$ may decrease from 0.123 μA to 1.54 nA, and the current fluctuation rate for the base current $I_B$ may increase 6400%. Further, the collector current $I_C$ may decrease from 0.97 μA to 0.953 μA, and the current fluctuation rate for the collector current $I_C$ may increase 1.79%. These results may indicate that the base current $I_B$ output of the magneto-resistance transistor may change in response to changes in the emitter current $I_E$ input.

Figure 5:
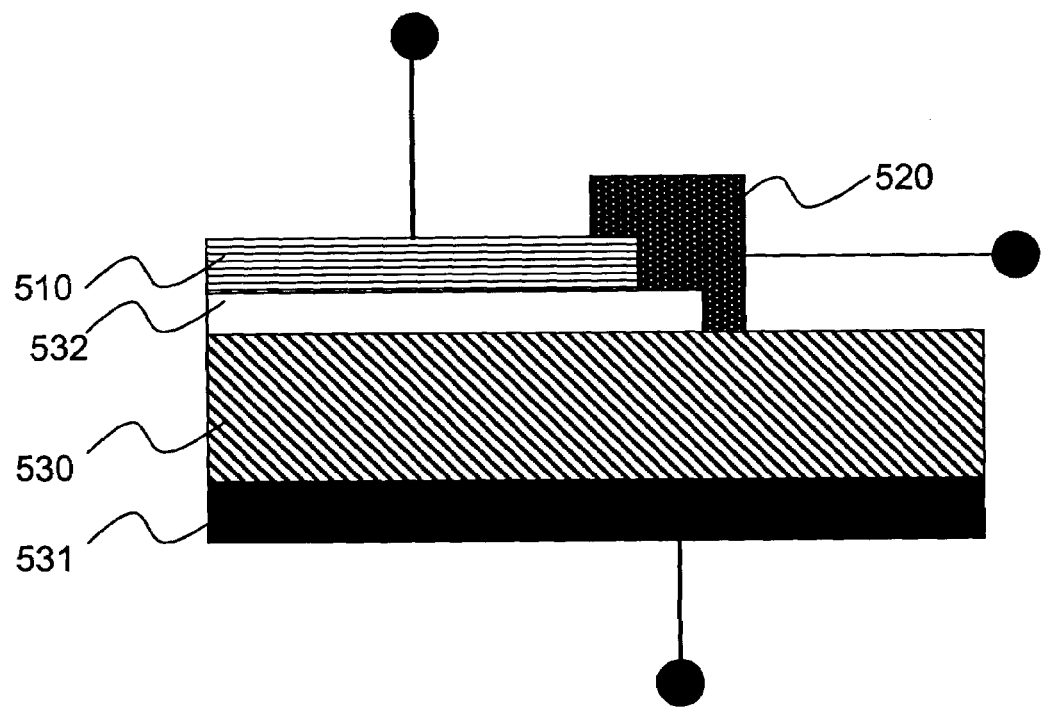
FIG. 5 illustrates a schematic view of a magneto-resistance transistor according to another example embodiment of the present invention.

FIG. 5 illustrates a schematic view of another magneto-resistance transistor 500 according to another example embodiment of the present invention.

In another example embodiment of the present invention, referring to FIG. 5 the magneto-resistance transistor 500 may include a magneto-resistant element 510 and a base 520.

In another example embodiment of the present invention, the magneto-resistant element 510 may function as an emitter of the magneto-resistance transistor 500.

In another example embodiment of the present invention, a p-n junction diode may be formed on the silicon substrate as passive element 530 (i.e., a collector).

In another example embodiment of the present invention, an ohmic contact layer 531 may be coated on a lower surface of the passive element 530 (i.e., the collector).

In another example embodiment of the present invention, the ohmic contact layer 531 may include at least one of titanium (Ti) and gold (Au).

In another example embodiment of the present invention, an insulating layer 532 may be formed on an upper surface of the passive element 530 (i.e., the collector), and a magneto-resistant element 510 may formed on the insulating layer 532.

In another example embodiment of the present invention, the magneto-resistant element 510 may be a spin valve magneto-resistant element. In this embodiment, the spin valve magneto-resistant element 510 may provide an adjustable resistance, the adjustable resistance determined by a given strength of an applied magnetic field.

In another example embodiment of the present invention, the base 520 may be interposed between the magneto-resistant element 510 (i.e. the emitter) and the passive element 530 (i.e. the collector), thus coupling the magneto-resistant element 510 with the passive element 530.

Figure 6:
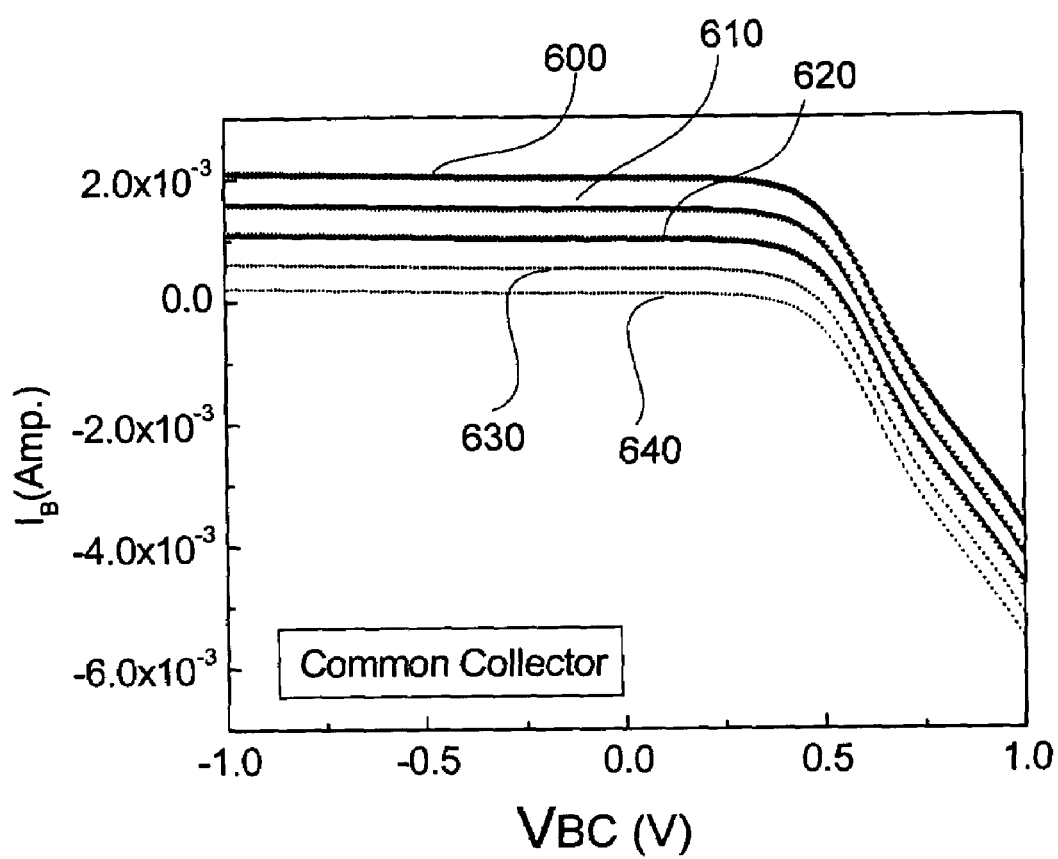
FIG. 6 is a graph illustrating characteristic curves of the base current $I_B$ of the magneto-resistance transistor of FIG. 5 according to another example embodiment of the present invention.

FIG. 6 is a graph illustrating characteristic curves 600, 610, 620, 630 and 640 of the base current $I_B$ of the magneto-resistance transistor 500 of FIG. 5 according to another example embodiment of the present invention.

In another example embodiment of the present invention, referring to FIG. 6, the ordinate axis may represent the base current $I_B$ while the abscissa axis may represent the base-to-collector voltage (i.e, base voltage bias) $V_{BC}$. The characteristic curves 600, 610, 620, 630 and 640 may illustrate a relationship between the base current $I_B$ and the base voltage bias $V_{BC}$ based on a given emitter current $I_E$. As shown, the given emitter current $I_E$ for the characteristic curves 600, 610, 620, 630 and 640 may be 0.1 μA, 0.5 μA, 1 μA, 1.5 μA, and 2 μA, respectively.

Figure 7:
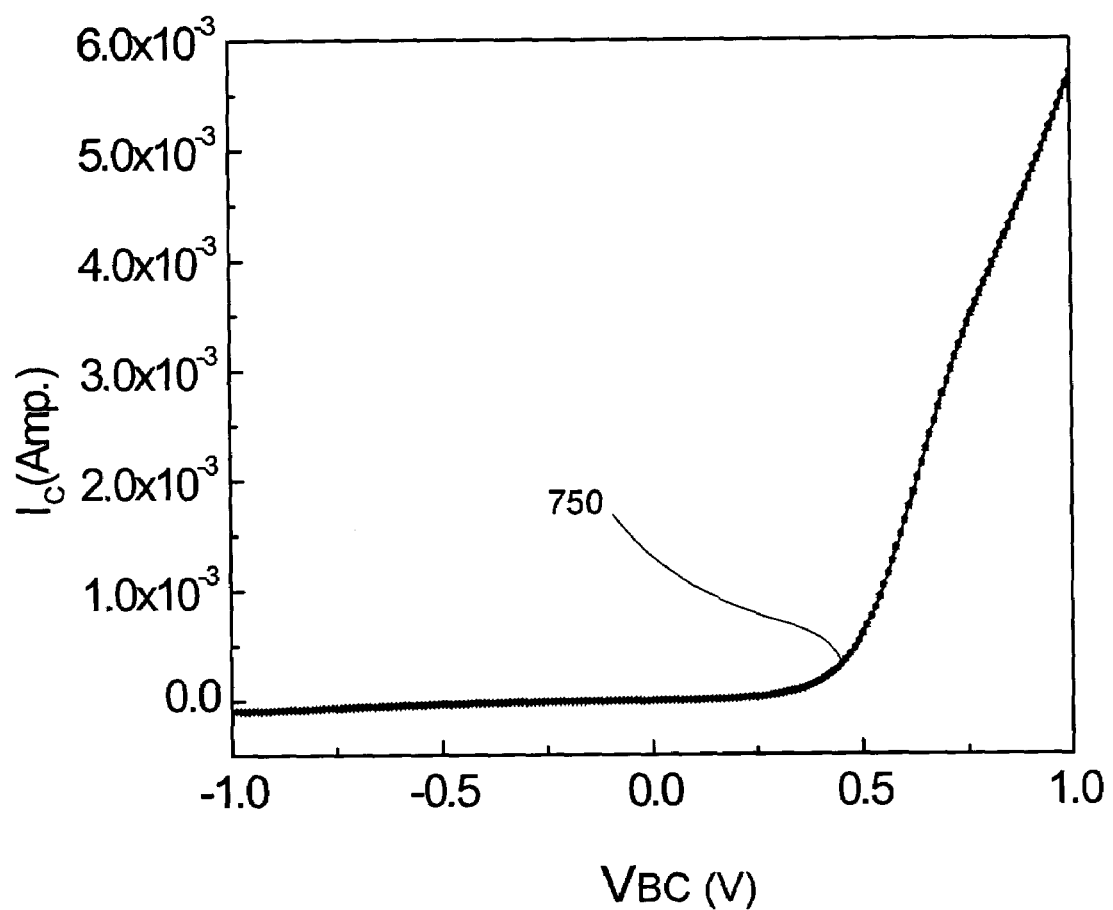
FIG. 7 is a graph illustrating a characteristic curve of the collector current $I_C$ of the magneto-resistance transistor of FIG. 5 according to another example embodiment of the present invention.

FIG. 7 is a graph illustrating a characteristic curve 750 of the collector current $I_C$ of the magneto-resistance transistor 500 of FIG. 5 according to another example embodiment of the present invention.

In another example embodiment of the present invention, referring to FIG. 7, the ordinate axis may represent the collector current $I_C$ while the abscissa axis may represent the base voltage bias $V_{BC}$. The characteristic curve 750 may illustrate a relationship between the collector current $I_C$ and the base voltage bias $V_{BC}$ based on a given emitter current $I_E$. As shown, the given emitter current $I_E$ for the characteristic curve 750 may be any one of 0.1 μA, 0.5 μA, 1 μA, 1.5 μA, and 2 μA, respectively. Thus, it may be observed that the collector current $I_C$ may not change in response to a change in the emitter current $I_E$.

Figure 8:
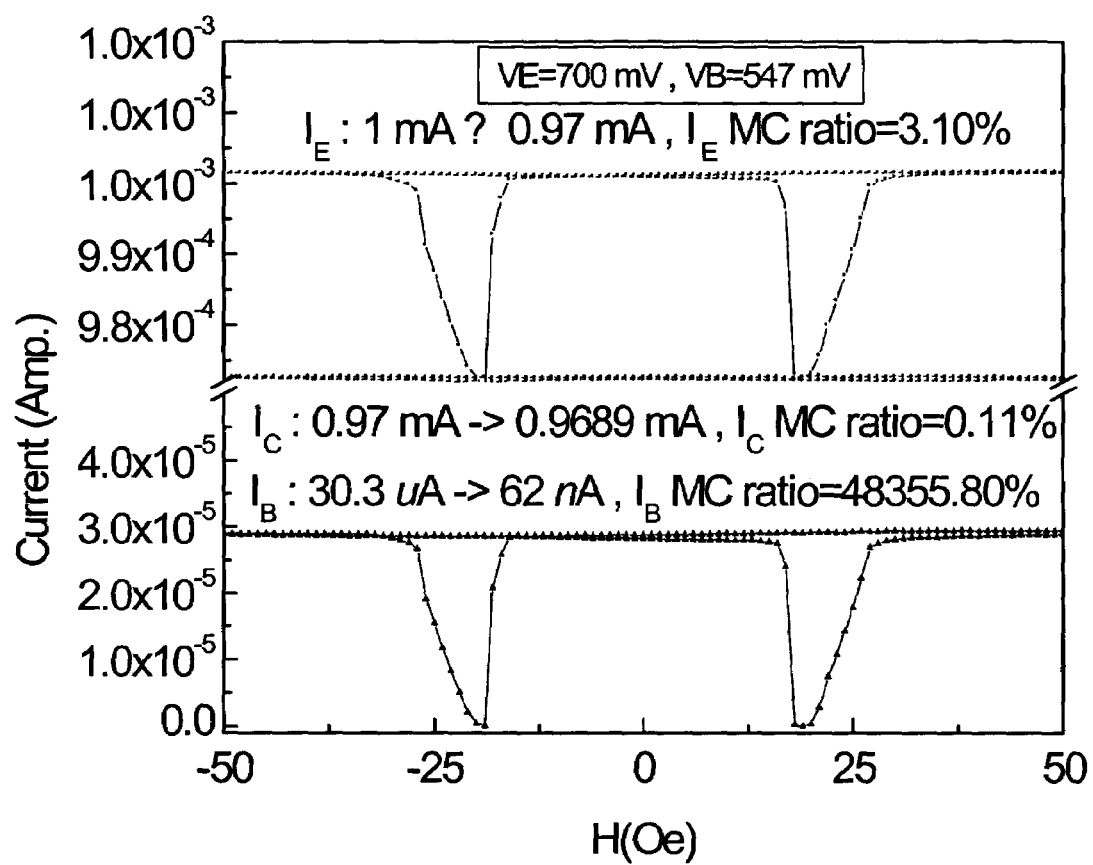
FIG. 8 is a graph illustrating a current fluctuation rate of the base, emitter and collector of FIG. 5 measured according to another example embodiment of the present invention.

FIG. 8 is a graph illustrating a current fluctuation rate of the base 520, emitter 510 and collector 530 of FIG. 5 measured according to another example embodiment of the present invention.

In another example embodiment of the present invention, referring to FIG. 8, the abscissa axis may represent a current variation (i.e. a variation of $I_B$, $I_C$, and/or $I_E$)., while the ordinate axis may represent a given strength of an applied magnetic field. As shown, the emitter current $I_E$ may decrease from 1 mA to 0.97 mA, and the current fluctuation rate of the emitter current $I_E$ may increase 3.1%. The base current $I_B$ may decrease from 30.3 μA to 62 nA, and the current fluctuation rate of the base current $I_B$ may increase 48,355%. The collector current $I_C$ may decrease from 0.97 mA to 0.969 mA, and the current fluctuation rate of the collector current $I_C$ may increase 0.11%. These results may further indicate that the base current $I_B$ output of the magneto-resistance transistor may change in response to changes in the emitter current $I_E$ input.

In another example embodiment of the present invention, referring to FIG. 5, the emitter 510, the base 520 and/or the collector 530 may be formed on a semiconductor substrate.

In another example embodiment of the present invention, the semiconductor substrate may be a silicon-based substrate.

In another example embodiment of the present invention, the semiconductor substrate may be a GaAs substrate.

In another example embodiment of the present invention, since the layer structure implemented in above-described example embodiments may not require a high quality structure, a complex semiconductor fabrication process may not be required in forming the above-described example embodiments. Further, a conventional substrate, for example a glass substrate and/or a plastic substrate, may be used to perform the coating process. Thus, semiconductor substrates may not be required in the formation of the magneto-resistance transistor.

Figure 9:
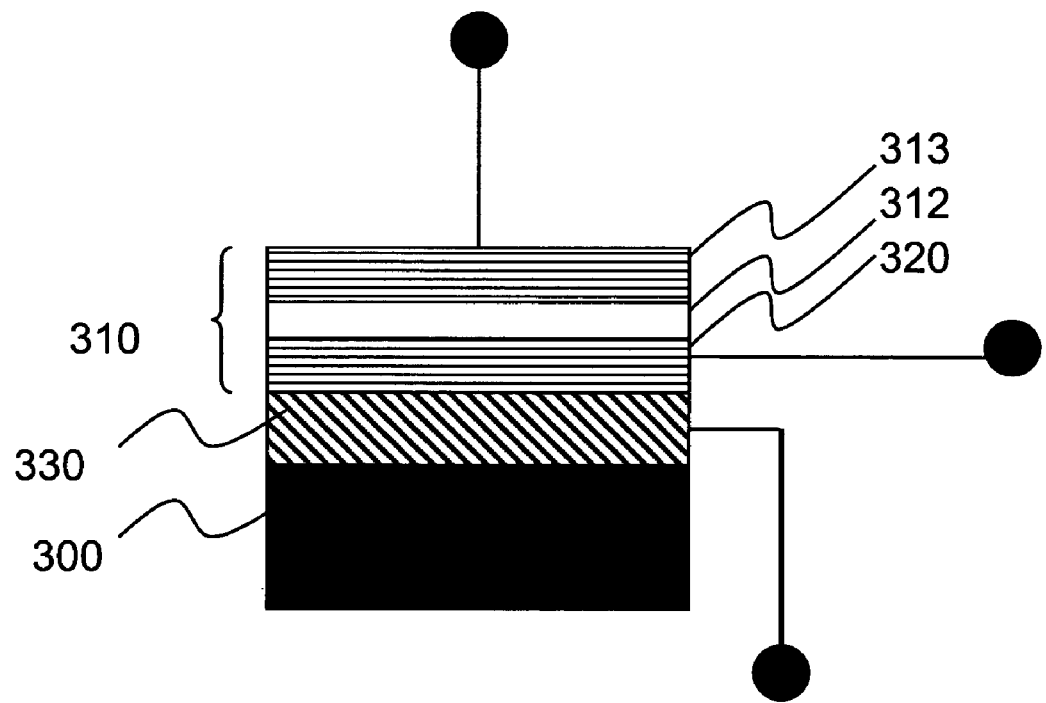
FIG. 9 illustrates a schematic view of a spin magneto-resistance transistor according to another example embodiment of the present invention.

FIG. 9 illustrates a schematic view of a spin magneto-resistance transistor 900 according to another example embodiment of the present invention.

In another example embodiment of the present invention, referring to FIG. 9, the spin magneto-resistance transistor 900 may include a magneto-resistant element 310 (i.e. an emitter) and a passive element 330 (i.e. a collector).

In another example embodiment of the present invention, the magneto-resistant element 310 and/or the passive element 330 may be coated and/or stacked on a substrate 300.

In another example embodiment of the present invention, the substrate 300 may be a glass substrate.

In another example embodiment of the present invention, the magneto-resistant element 310 may function as both an emitter and a base, and the passive element 330 may be a resistor formed on the substrate 300 as a collector. In this embodiment, the magneto-resistant element 310 may include an adjustable resistance, the adjustable resistance determined by a strength of an applied magnetic field.

In another example embodiment of the present invention, referring to FIG. 9, the magneto-resistant element 310 may be a tunnel magneto-resistant element. The magneto-resistant element 310 may further include a first ferromagnetic layer 320 (i.e. the base), an insulating layer 112 and a second ferromagnetic layer 113. As shown in FIG. 9, the first ferromagnetic layer 320 may connect to the passive element 330, thereby forming the base. The base (i.e. the ferromagnetic layer 320) may be interposed between the emitter (i.e. the magneto-resistant element 310) and the collector (i.e. the passive element 330), thereby coupling the emitter with the collector.

In another example embodiment of the present invention, the spin magneto-resistance transistor 900 of FIG. 9 may be tested similar to the magneto-resistance transistor 100 of FIG. 1. A test wherein voltages may be applied to the magneto-resistance transmitter 900 and a subsequent response of the spin magneto-resistance transistor 900 may be measured will now be described.

Figure 10:
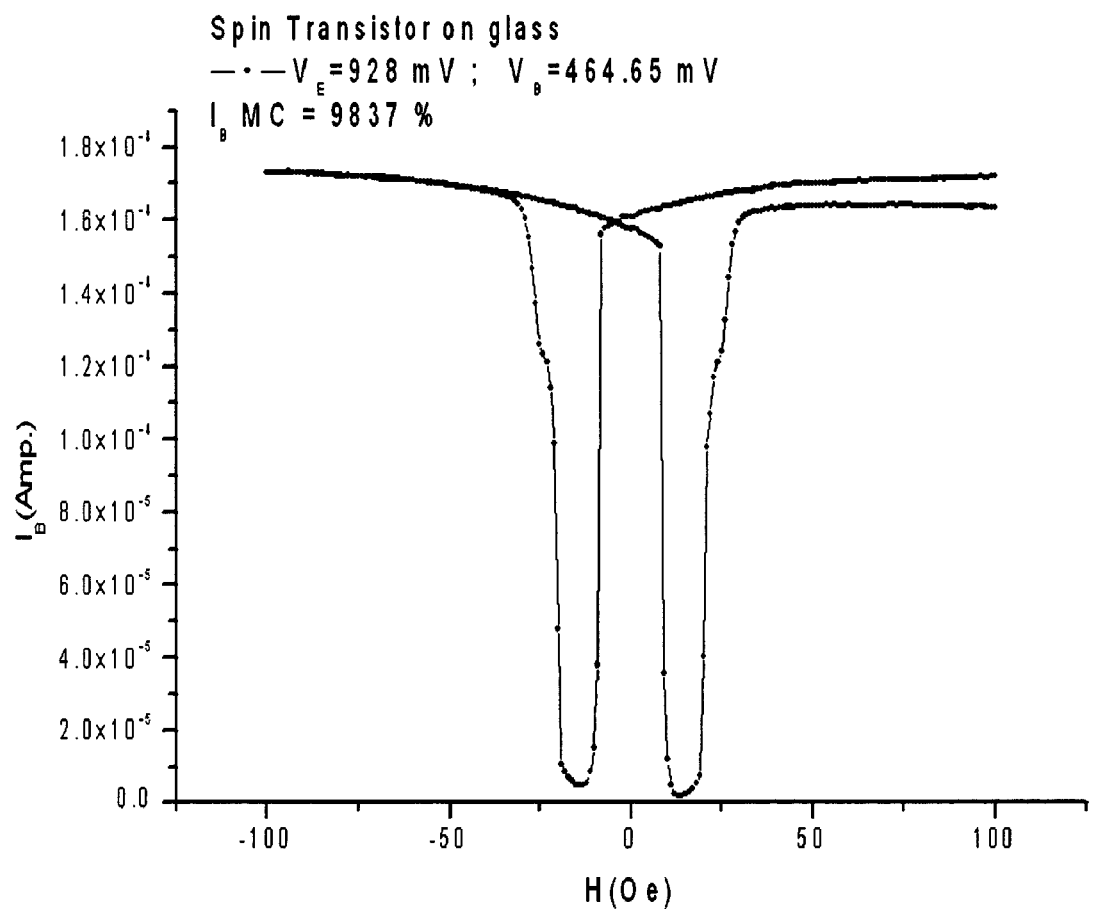
FIG. 10 is a graph illustrating the current fluctuation rate of the base, emitter and collector of FIG. 9 as measured in another example of the present invention.

FIG. 10 is a graph illustrating the current fluctuation rate of the base 320, emitter 310 and collector 330 of FIG. 9 as measured in another example of the present invention.

In order to test the base current fluctuation rate of the spin magneto-resistance transistor 900 of FIG. 9, an emitter voltage of 928 mV and a base voltage of 464.65 mV may be applied at the emitter 310 and the collector 330, respectively, of the spin magneto-resistance transistor 900. It is understood that this example emitter voltage and base voltage are used for purposes of example only, and any voltage may be used to test the spin magneto-resistance transistor 900.

Referring to FIG. 10, the abscissa axis may represent a level of current and the ordinate axis may represent a given strength of an applied magnetic field. Under the given strength of the applied magnetic field, as shown in FIG. 10, the base current fluctuation rate may increase 9,837%. Thus, a magneto-resistance transistor formed by applying a coating process on the substrate (i.e. the spin magneto-resistance transistor 900 formed on the substrate 300 of FIG. 9) may have a base current $I_B$ output that fluctuates based on the emitter current $I_E$. Furthermore, a magnitude of the current fluctuation rate may overcome the process limitations of conventional transistors, and thus may reduce manufacturing costs while providing enhanced performance.

In another example embodiment of the present invention, the magneto-resistant element implemented in the above-described example embodiments may be a tunnel magneto-resistant element, a spin valve element, and/or a giant magneto-resistant element.

In another example embodiment of the present invention, in addition to a p-n junction diode and/or a Schottky diode as described above in example embodiments, a passive element (i.e. the collector), for example the passive element 330 of FIG. 9, may include any type of diode and/or resistor.

In another example embodiment of the present invention, the diode may include at least one of a p-n junction diode, a p-i-n diode, a Schottky-barrier diode, a planar-doped-barrier diode, a tunnel diode, a resonant-tunneling diode, a resonant-interband-tunneling diode, a single-barrier tunnel diode, a single-barrier an interband-tunneling diode, a real-space-transfer diode, a heterostructure hot-electron diode, an impact-ionization-avalanche transit-time diode, a barrier-injection transit-time diode, a p-i-n photodiode, a Schottky-barrier photodiode and/or an avalanche photodiode.

In another example embodiment of the present invention, any of the elements of the magneto-resistance transistor may be formed with a semiconductor manufacturing process. Thus, the emitter, the base and/or the collector may be formed on the semiconductor substrate and/or on any other type of substrate. The semiconductor substrate may include a silicon substrate and/or a GaAs substrate. Thus, the current input (i.e., at the collector), the corresponding current output, (i.e., at the emitter) and the base current fluctuation rate of the magneto-resistance transistor may be increased.

The example embodiments of the present invention being thus described, it will be obvious that the same may be varied in many ways. For example, various figures illustrate graphs of measured current characteristics of various example magneto-resistance transistors. However, it is understood that while these graphs are used as specific examples, any input currents, voltages and/or resistances may be used to test various example magneto-resistance transistors.

Such variations are not to be regarded as departure from the spirit and scope of the example embodiments of the present invention, and all such modifications as would be obvious to one skilled in the art are intended to be included within the scope of the following claims.

What is claimed is:

1. A magneto-resistance transistor comprising:
   a passive element adapted to function as a collector; and
   a magneto-resistant element including a first portion adjacent to the passive element, a second portion, and an insulating layer interposed between the first portion and the second portion, wherein the magneto-resistant element has an adjustable resistance based on a given strength of a magnetic field.

2. The magneto-resistance transistor of claim 1, wherein the magneto-resistant element includes at least one magnetic film.

3. The magneto-resistance transistor of claim 1, wherein the at least one magnetic film includes a ferromagnetic layer adjacent to the passive element.

4. The magneto-resistance transistor of claim 3, wherein the ferromagnetic layer is the first portion.

5. The magneto-resistance transistor of claim 1, wherein the first portion is a base and the second portion is an emitter.

6. The magneto-resistance transistor of claim 1, wherein the magneto-resistant element includes at least one of a tunnel magneto-resistant element, a spin valve magneto-resistant element, and a giant magneto-resistant element.

7. The magneto-resistance transistor of claim 1, wherein the passive element includes at least one of a diode and a resistor.

8. The magneto-resistance transistor of claim 7, wherein the diode includes at least one of a p-n junction diode, a p-i-n diode, a Schottky-barrier diode, a planar-doped-barrier diode, tunnel diode, a resonant-tunneling diode, a resonant-interband-tunneling diode, a single-barrier tunnel diode, a single-barrier interband-tunneling diode, a real-space-transfer diode, a heterostructure hot-electron diode, an impact-ionization-avalanche transit-time diode, a barrier-injection transit-time diode, a p-i-n photodiode, a Schottky-barrier photodiode and an avalanche photodiode.

9. The magneto-resistance transistor of claim 1, further comprising an ohmic contact layer.

10. The magneto-resistance transistor of claim 9, wherein the ohmic contact layer is connected to the passive element.

11. The magneto-resistance transistor of claim 9, wherein the ohmic contact layer increases an external electrical conduction.

12. The magneto-resistance transistor of claim 1, wherein the passive element and the magneto-resistant element are formed on a substrate.

13. The magneto-resistance transistor of claim 12, wherein the passive element and the magneto-resistant element are formed on a same plane of the substrate.

14. The magneto-resistance transistor of claim 12, wherein the passive element and the magneto-resistant element are stacked on the substrate.

15. The magneto-resistance transistor of claim 12, wherein the substrate is a semiconductor substrate.

16. The magneto-resistance transistor of claim 15, wherein the semiconductor substrate includes at least one of a silicon substrate and a GaAs substrate.

17. The magneto-resistance transistor of claim 12, wherein the substrate is a glass substrate.

18. The magneto-resistance transistor of claim 12, wherein the substrate includes plastic.

19. The magneto-resistance transistor of claim 1, wherein the magneto-resistant element, the passive element and the base are formed with a semiconductor manufacturing process and the emitter, the base and the collector can be integrally formed on a substrate.

* * * * *

UNITED STATES PATENT AND TRADEMARK OFFICE
CERTIFICATE OF CORRECTION

| | | |
|---|---|---|
| PATENT NO. | : 7,372,117 B2 | Page 1 of 1 |
| APPLICATION NO. | : 10/942114 | |
| DATED | : May 13, 2008 | |
| INVENTOR(S) | : Ying-Wen Huang et al. | |

It is certified that error appears in the above-identified patent and that said Letters Patent is hereby corrected as shown below:

Title page, item (75), the country name of the 2nd inventor should be (TW)

Signed and Sealed this

Fifth Day of August, 2008

JON W. DUDAS
*Director of the United States Patent and Trademark Office*